United States Patent
Kurokawa et al.

(10) Patent No.: US 7,705,365 B2
(45) Date of Patent: Apr. 27, 2010

(54) LIGHTING DEVICE AND LIGHT EMITTING MODULE FOR THE SAME

(75) Inventors: Kazumasa Kurokawa, Kariya (JP); Yosimi Kondo, Anjo (KR)

(73) Assignee: Denso Corporation, Kariya (JP)

( * ) Notice: Subject to any disclaimer, the term of this patent is extended or adjusted under 35 U.S.C. 154(b) by 203 days.

(21) Appl. No.: 11/656,433

(22) Filed: Jan. 23, 2007

(65) Prior Publication Data
US 2007/0170452 A1    Jul. 26, 2007

(30) Foreign Application Priority Data

| Jan. 24, 2006 | (JP) | ............................. 2006-015619 |
| May 11, 2006 | (JP) | ............................. 2006-133071 |
| May 11, 2006 | (JP) | ............................. 2006-133072 |

(51) Int. Cl.
*H01L 23/367* (2006.01)
(52) U.S. Cl. ........................... 257/99; 257/88; 257/100; 257/E33.058; 257/E33.059; 257/E33.075; 362/600; 362/608; 362/612; 362/631
(58) Field of Classification Search .................. 257/88, 257/99, 100, E33.058, E33.059, E33.075; 362/600, 608, 612, 631
See application file for complete search history.

(56) References Cited

U.S. PATENT DOCUMENTS

| 5,614,735 | A |   | 3/1997 | Kitamura et al. |
| 5,857,767 | A | * | 1/1999 | Hochstein .................... 362/294 |
| 5,975,715 | A | * | 11/1999 | Bauder ........................ 362/549 |
| 6,274,924 | B1 |  | 8/2001 | Carey et al. |
| 6,582,100 | B1 | * | 6/2003 | Hochstein et al. ........... 362/294 |
| 6,821,143 | B2 |  | 11/2004 | Gasquet et al. |
| 6,951,401 | B2 | * | 10/2005 | Van Hees et al. ............ 362/612 |
| 7,258,466 | B2 |  | 8/2007 | Watanabe et al. |
| 7,275,851 | B2 |  | 10/2007 | Sakurai |
| 7,462,870 | B2 | * | 12/2008 | Nakashima ................... 257/81 |
| 2004/0004424 | A1 |  | 1/2004 | Sakurai |
| 2004/0029436 | A1 |  | 2/2004 | Gasquet et al. |

(Continued)

FOREIGN PATENT DOCUMENTS

JP           5-3330           1/1993

(Continued)

OTHER PUBLICATIONS

Japanese Office Action dated Nov. 17, 2009, issued in corresponding Japanese Application No. 2006-133072, with English translation.

*Primary Examiner*—Davienne Monbleau
*Assistant Examiner*—Eduardo A Rodela
(74) *Attorney, Agent, or Firm*—Nixon & Vanderhye, PC

(57) ABSTRACT

A light emitting module of a lighting device has a casing, a heat radiating member and terminals. The terminals extend from the casing and connects to a circuit board disposed along a light diffusing member. The heat radiating member extends in a direction perpendicular to the terminals. Alternatively, the terminals are connected to heat radiating lands formed on a second circuit board that is provided separately from a first circuit board and the heat radiating member is connected to a heat radiating land formed on the second circuit board. Further, the heat radiating member can be connected to a heat radiating plate overlapping with the second circuit board, in place of the heat radiating land.

9 Claims, 10 Drawing Sheets

U.S. PATENT DOCUMENTS

2005/0180157 A1    8/2005    Watanabe et al.
2009/0213301 A1    8/2009    Tanabe

FOREIGN PATENT DOCUMENTS

| | | |
|---|---|---|
| JP | 5-79512 | 10/1993 |
| JP | 2000-183406 | 6/2000 |
| JP | 2001-160312 | 6/2001 |
| JP | 2004-291949 | 10/2004 |

* cited by examiner

LIGHTING DEVICE AND LIGHT EMITTING MODULE FOR THE SAME

CROSS REFERENCE TO RELATED APPLICATION

This application is based on Japanese Patent Applications No. 2006-15619 filed on Jan. 24, 2006, No. 2006-133071 filed on May 11, 2006 and No. 2006-133072 filed on May 11, 2006, the disclosures of which are incorporated herein by reference.

FIELD OF THE INVENTION

The present invention relates to a lighting device and a light emitting module for the same.

BACKGROUND OF THE INVENTION

A lighting device for an instrument for a vehicle is for example known in Japanese Unexamined Patent Publication No. 2004-291949. The lighting device is an edge-type lighting device in which a light emitting diode is optically coupled at an edge of the light conducting plate. In the edge-type lighting device, the light emitting diode emits light toward a light incident surface of the light conducting plate. The light conducting plate diffuses the light therein and radiates the diffused light uniformly from its light radiating surface toward a dial board of the instrument. Thus, the dial board is visible with uniform brightness.

In such an edge-type lighting device, an on-chip light emitting diode is mounted to and electrically connected to a sub-circuit board, which is provided only for the light emitting diode, i.e., provided separately from a main circuit board for controlling respective components of an instrument. A light conducting plate is arranged parallel to the main circuit board. The sub-circuit board is for example held perpendicular to the light conducting plate such that an optical axis of the light is substantially parallel to the light conducting plate. Here, the sub-circuit board functions to supply electric power to the light emitting diode and to radiate heat generated from the light emitting diode.

Japanese Unexamined Patent Publication No. 2001-160312 also discloses a lighting device. In the lighting device, an on-chip type light emitting diode module is mounted to a circuit board. In the lighting device, the circuit board is made of metal such as aluminum for improving radiation of heat generated from the light emitting diode module. Electrodes (connection terminals) of the light emitting diode module and lands (conductive patterns) formed on the circuit board function as power supplying means and heat radiating means. Namely, the heat generated from the light emitting diode module is transferred to the circuit board through the electrodes and the lands and radiated from the circuit board.

SUMMARY OF THE INVENTION

The present invention is made in view of the foregoing matter, and it is an object of the present invention to provide a lighting device with a reduced size and a light emitting module for the lighting device.

It is another object of the present invention to provide a lighting device with improved heat radiation.

According to an aspect of the present invention, a lighting device has a light emitting module, a circuit board for driving the light emitting module and a light diffusing member. The light diffusing member is disposed along the circuit board for diffusing light that is incident from its light incident surface and uniformly radiating the light diffused therein toward a radiation area. The light emitting module has a light emitting element, a casing housing the light emitting element, a terminal and a first heat radiating member. The light emitting module is disposed such that the light emitted from the light emitting element is incident on the light incident surface of the light diffusing member. The terminal extends from the casing and is electrically connected to the circuit board. The first heat radiating member extends in a direction perpendicular to the terminal.

Accordingly, since the first heat radiating member extend in the direction perpendicular to the terminal, heat generated from the light emitting element is radiated through the first heat radiating member. Therefore, it is less likely that the circuit board will be affected by the heat generated from the light emitting module. In this construction, it is not necessary to have a second circuit board for supplying electric power to the light emitting element and radiating heat generated from the light emitting element. Namely, the number of the circuit boards is reduced, as compared with a conventional lighting device. Therefore, a size of the lighting device in a direction perpendicular to the light diffusing member reduces, and costs reduce.

According to a second aspect of the present invention, a lighting device has a circuit board and a light emitting module. The circuit board includes a metal base, a heat radiating land and a conducting land. The heat radiating land is disposed such that its end is aligned with an end of the metal base. The conducting land is disposed opposite to the end of the metal base with respect to the heat conducting plate. The light emitting module has a casing, a heat radiating member and a terminal. The casing has a first surface through which light is emitted and a second surface opposite to the first surface and joined to the circuit board. The heat radiating member is disposed to the casing such that at least a part of the heat radiating member is exposed from the casing and connected to the heat radiating land. The terminal is connected to the conducting land.

In this construction, the heat radiating land and the conducting land are separately formed. Therefore, even if the end of the circuit board has burrs due to cutting process of the metal base it is less likely that the conducting land will short-circuit with the circuit board due to the burrs. Since the heat radiating land can be arranged such that its end is aligned with the end of the metal base, even if the metal base has the burrs, a size of the light device reduces.

According to a third aspect of the present invention, a lighting device has a circuit board, a heat radiating plate and a light emitting module for emitting light. The heat radiating plate overlaps the circuit board and has an exposed portion that is exposed from the circuit board. The light emitting module has a casing, a heat radiating member and a terminal. The heat radiating member is disposed such that at least a part of the heat radiating member is exposed from the casing and connected to the heat radiating plate. The terminal extends from the casing and connects to the circuit board.

In this construction, the light emitting module receives electric power from the circuit board and heat generated from the light emitting module is transferred to the heat radiating plate. Because the heat radiating plate does not need to have a conductor pattern for supplying electric power to the light emitting module, it is not necessary to form an insulating layer on its surface. Therefore, the heat generated from the light emitting module is directly transferred to the heat radiating plate through the heat radiating member. Accordingly, heat radiating performance improves.

According to a fourth aspect of the present invention, a lighting device has a circuit board, a heat radiating plate and a light emitting module for emitting light. The heat radiating plate is disposed along a first surface of the circuit board such that a part of the heat radiating plate is exposed from the circuit board. The heat radiating plate has an opening in the part exposed from the circuit board. The light emitting module is disposed such that a light emitting part corresponds to the opening of the heat radiating plate. The light emitting module has a heat radiating member connected to the heat radiating plate and a terminal connected to a second surface of the circuit board.

Also in this construction, since the light emitting module receives electric power from the circuit board, the heat radiating plate does not need to have a conductor pattern for electric power supply and an insulating layer for the conductor pattern. Since the heat generated from the light emitting module is effectively transferred to the heat radiating plate through the heat radiating member, heat radiating performance improves.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EXAMPLE EMBODIMENTS

First Embodiment

A first embodiment of the present invention will be described with reference to FIGS. 1 to 5. In figures, an up and down direction and a front and rear direction denoted by arrows A, B correspond to directions referred in the following description. The directions denoted by the arrows A, B are used for convenience of description, and are not irrelevant to mounting directions of a lighting device when in use.

Figure 1:
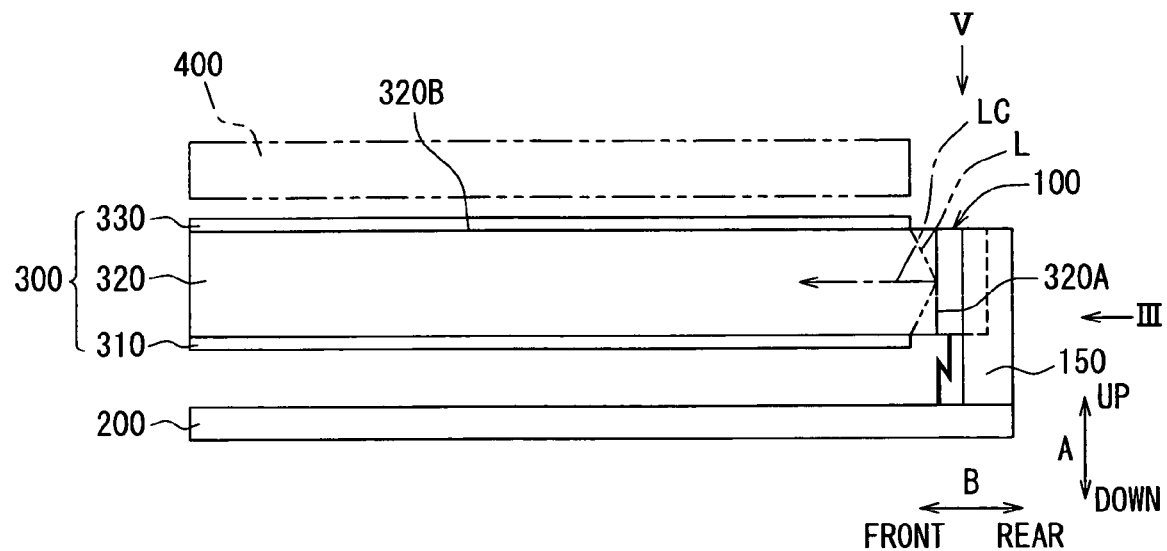
FIG. 1 is a side view of a back light device according to a first embodiment of the present invention.

As shown in FIG. 1, a lighting device is for example employed as a back light device of an instrument for a vehicle. The back light device is an edge-light type lighting device, and has a light emitting diode module 100 for emitting a light L (hereafter, light emitting module), a circuit board 200 for driving the light emitting module 100 and a light diffusing member 300 for diffusing the light L therein and radiating the diffused light toward a radiation area such as toward a dial board 400.

The light emitting module 100, the circuit board 200 and the light diffusing member 300 are held in respective positions in a case (not shown). The light diffusing member 300 is arranged substantially parallel to the circuit board 200.

Figure 2:
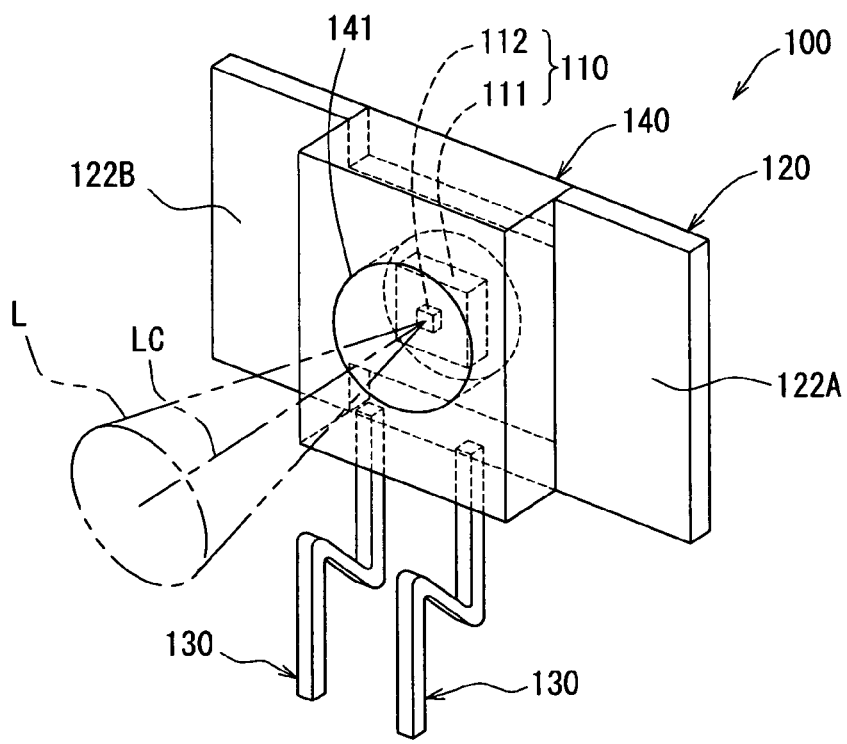
FIG. 2 is a perspective view of a light emitting diode module of the back light device according to the first embodiment.

As shown in FIG. 2, the light emitting module 100 has a light emitting part 110 that emits the light L, a heat radiating plate (first heat radiating member) 120 for radiating heat generated from the light emitting part 110, connection terminals 130 electrically connected to the circuit board 200 and a casing 140 that constitutes a main portion of the light emitting module 100.

The casing 140 is formed by molding and has a rectangular parallelepiped shape. The casing 140 has a light transmitting portion 141, which allows the light L to pass through, on its front side facing a light incident surface 320A of the light diffusing member 300. The light transmitting portion 141 is formed at a position corresponding to an area where a beam of light L is formed. The light transmitting portion 141 is for example made of a resin such as epoxy resin or silicone. For example, the epoxy resin and the silicone can contain fluorescent material, filler, and the like.

Figure 3:
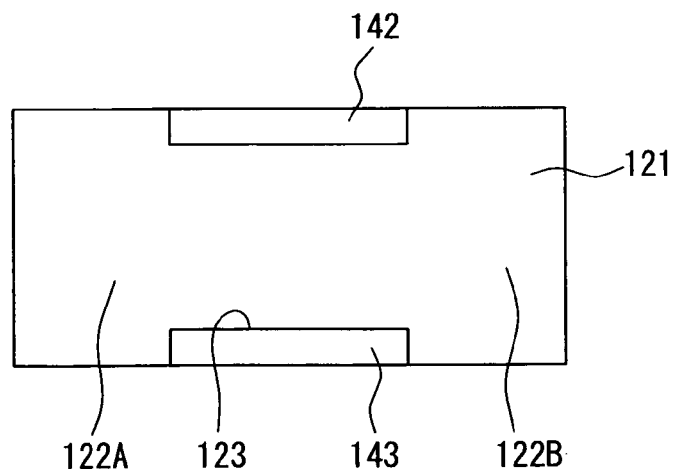
FIG. 3 is an end view of the back light device when viewed along an arrow III in FIG. 1.

The casing 140 has two projections 142, 143 on its rear side. The projections 142, 143 project from a rear upper end and a rear lower end of the casing 140, respectively, and extend in a right and left direction of the casing 140. The projections 142, 143 hold the first heat radiating member 120 between them such that a rear surface 121 of the first heat radiating member 120 is fully exposed from the casing 140, as shown in FIGS. 2 and 3. In other words, the rear surface 121 of the first heat radiating member 120 is not covered by the projections 142, 143.

The light emitting part 110 is housed in the casing 140. The lighting portion 110 for example emits white light. The lighting portion 110 has a dice 111 and a light emitting element 112 arranged on the dice 111. In the light emitting part 110, electrodes provided on the dice 111 are electrically connected to the terminals 130 such as by wire-bonding. Thus, electric current is supplied to the light emitting element 112 for generating the light L.

Figure 4:
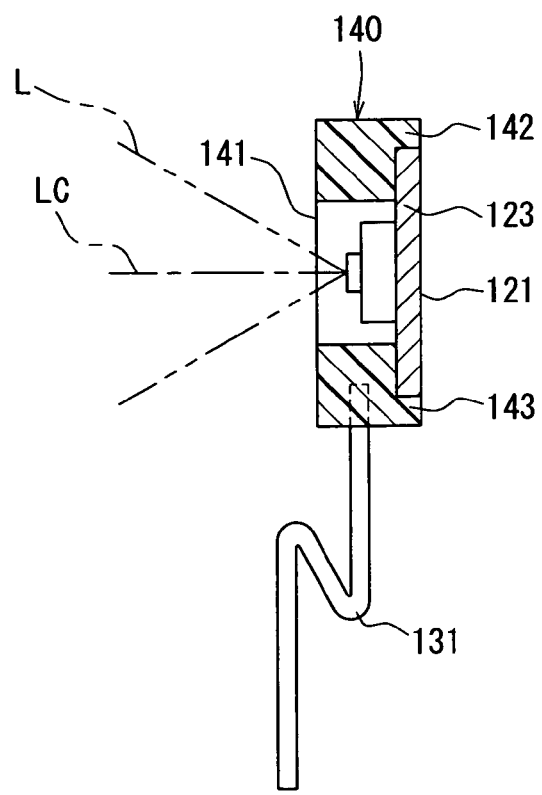
FIG. 4 is a schematic cross-sectional view of the light emitting diode module according to the first embodiment.

The dice 111 is arranged in the casing 140 such that an optical axis LC of the light L is perpendicular to the front surface of the casing 140. Also, a rear surface of the dice 111 is in contact with the first heat radiating member 120 so as to enhance radiation of the heat generated from the light emitting element 112, as shown in FIGS. 2 and 4.

The first heat radiating member 120 is disposed on a rear side of the casing 140. As shown in FIG. 3, the first heat radiating member 120 has first and second extending portions (exterior portions) 122A, 122B and a middle portion (interior portion) 123 between the first and second extending portions 122A, 122B. As shown in FIG. 2, the first and second extending portions 122A, 122B extends in the right and left direction. When the light emitting module 100 is viewed from the front side, the first and second extending portions 122A, 122B are located outside of the casing 140.

For example, the first and second extending portions 122A, 122B have the same dimension as the casing 140 in the up and down direction. However, the dimension of the first and second extending portion 122A, 122B in the up and down direction can be smaller than that of the casing 140.

The middle portion 123 has a dimension in the up and down direction that corresponds to a distance between the projections 142, 143. The middle portion 123 is located between the projections 142, 143, as shown in FIG. 3. As such, the first heat radiating member 120 is held by the projections 142, 143 such that its rear surface 121 is fully exposed, i.e., is not covered by the casing 140.

The middle portion 123 is formed in the substantially middle of the first heat radiating member 120 in the right and left direction. The first and second extending portions 122A, 122B have substantially equal length in the right and left direction.

Figure 5:
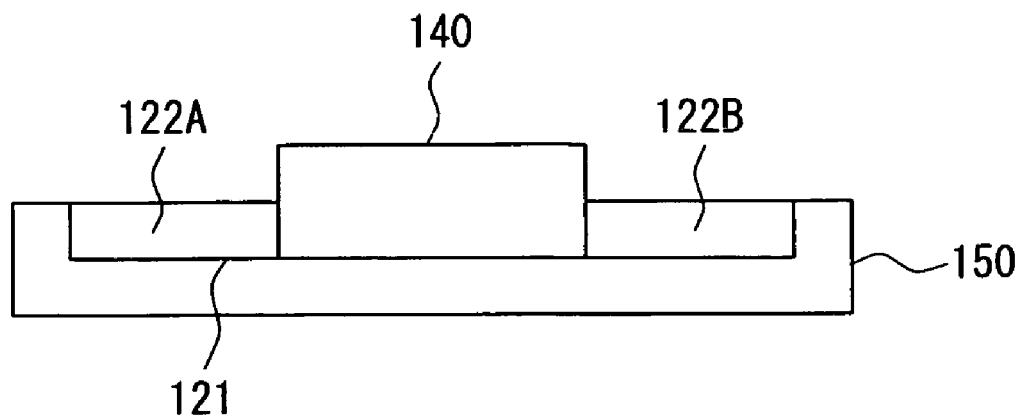
FIG. 5 is a top view of the light emitting diode module with a second heat radiating member when viewed along an arrow V in FIG. 1.

The back light device further has a second heat radiating member 150 on the rear side of the first heat radiating member 120. As shown in FIG. 5, the second heat radiating member 150 has a substantially U-shape when viewed from its top. The first heat radiating member 120 is received in a cavity defined by the U-shaped second heat radiating member 150 such that the rear surface 121 is in contact with an inner surface (front surface) of the second heat radiation member 150. Although not illustrated, the second heat radiation member 150 can be provided with fins on its rear surface so as to increase a heat radiation area.

The terminals 130 extend from a bottom surface of the casing 140. The ends of the terminals 130 are electrically connected to the circuit board 200 such as by soldering. As shown in FIGS. 2 and 4, each of the terminals 130 has a bend portion 131 at its middle position. For example, the terminal 130 has a Z letter shape.

Because the bend portion 131 is flexible, the terminal 130 can bend and stretch in the up and down direction according to a displacement of the light emitting module 100 relative to the circuit board 200. In other words, the terminals 130 can follow the displacement of the light emitting module 100 relative to the circuit board 200.

Accordingly, the first and second extending portions 122A, 122B extend in the direction perpendicular to the optical axis LC of the light L, and an axis of the terminals 130 is perpendicular to the optical axis LC and the first and second extending portions 122A, 122B. In other words, the optical axis LC, the first and second extending portions 122A, 122B and the terminals 130 are perpendicular to each other.

For example, the circuit board 200 is a resinous board such as a glass epoxy board. On the circuit board 200, an integrated circuit and circuit elements for operating components of the instrument are mounted. Also, the circuit board 200 is electrically connected to the light emitting module 100.

The light diffusing member 300 is disposed substantially parallel to the circuit board 200. The light diffusing member 300 is provided for diffusing and reflecting the light L so as to radiate the light L toward the dial board 400 with an uniformed brightness.

As shown in FIG. 1, the light diffusing member 300 has a reflecting sheet 310 for reflecting light, a light conducting plate 320 laid on the reflecting sheet 310, and a diffusing sheet 330 laid on the light conducting plate 320 on a side opposite to the reflecting sheet 310. In the light conducting plate 320, the light L that is incident from the light incident surface 320A is diffused and reflected, and is uniformly radiated over a light radiating surface 320B. Thus, the light L is radiated toward the dial board 400 through the diffusing sheet 330. Accordingly, the dial board 400 is visible with uniformed brightness.

Specifically, the reflecting sheet 310 reflects light that is emitted outward from a rear surface (lower surface in FIG. 1) of the light conducting plate 320 toward the light conducting plate 320 again. The diffusing sheet 330 uniforms light that is emitted outward from a front surface (upper surface in FIG. 1) of the light conducting plate 320. Alternatively, the light diffusing member 300 can be constructed of only the reflecting sheet 310 and the diffusing sheet 330.

Accordingly, the light emitting module 100 is electrically connected to the circuit board 200 and arranged such that the light L is emitted to the light incident surface 320A of the light diffusing member 300 and the first heat radiating member 120 is located on a side opposite to the light diffusing member 300 with respect to the casing 400. The light emitting module 100 emits the light L on receiving electric current from the circuit board 200. The heat generated from the light emitting module 100 while lighting is transferred to the first heat radiating member 120 and the second heat radiating member 150 and released.

As such, the heat generated from the light emitting module 100 is released by the light emitting module 100 itself. Therefore, even if the light emitting module 100 is electrically connected to the circuit board 200 that have the circuit elements and the like for driving the instrument, the circuit elements and the like on the circuit board 200 will not be affected by the heat of the light emitting module 100.

In this construction, a specific circuit board for the light emitting module 100, i.e., a sub-circuit board for giving a heat radiation function and a power supply function is not required. Namely, the back light device has a single circuit board. Therefore, costs will be reduced as compared to a lighting device having two circuit boards.

In a lighting device having a main circuit board and a sub-circuit board for a light emitting module, the sub-circuit board is arranged perpendicular to the main circuit board. On cutting out the sub-circuit in its manufacturing process, it is cut with a predetermined margin (e.g., 1.5 mm) between an end and a wiring pattern in consideration of damages to the wiring pattern. That is, the wiring pattern is formed at a position separated from an end of the sub-circuit board. In this case, it is difficult to reduce the dimension of the sub-circuit board in the up and down direction.

In the embodiment, on the other hand, since the sub-circuit board is not required, the dimension of the back light device can be reduced, as compared with the lighting device having such a sub-circuit board.

Further, the light emitting module 100 will be displaced relative to the circuit board 200 with thermal expansion of the second heat radiation member 150 due to the heat generated from the light emitting module 100 or by interference with external parts or devices. Even in this case, the bend portions 131 of the terminal 130 can bend and stretch according to the displacement of the light emitting module 100. Therefore, it is less likely that the jointing portions (e.g., soldering) between the terminals 130 and the circuit board 200 will receive stress. Accordingly, electric connection of the terminals 130 will reduce.

In addition, since the rear surface 121 of the first heat radiating member 120 is exposed from the casing 140 and is in contact with and covered by the second heat radiating member 150, heat radiation efficiency improves. Furthermore, the second heat radiating member 150 has a heat radiating surface larger than that of the first heat radiating member 120. Therefore, the heat radiation efficiency further improves.

In a case that plural light emitting modules 100 are arranged next to each other, heat is likely to be stagnant between the adjacent modules 100. However, the extending portions 122A, 122B extend in the right and left direction, i.e., in the direction perpendicular to the optical axis LC. Therefore, even if the plural modules 100 are arranged next to each other, heat will be effectively released.

Also, since the first and second extending portions 122A, 122B have symmetrical structure with respect to the optical axis LC, the heat can be equally radiated through the first and second extending portions 122A, 122B. Further, it makes easy to position the first heat radiating member 120 to the second heat radiating member 150.

Figure 6:
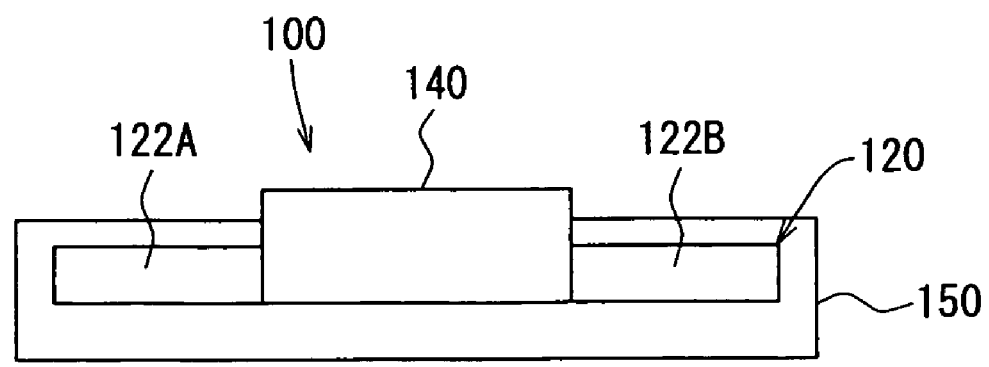
FIG. 6 is a top view of the light emitting diode module and another example of the second heat radiating member according to the first embodiment.

In the example shown in FIG. 5, the second heat radiating member 150 have the U-shaped structure. Instead, the second heat radiating member 150 can have an annular shape with a closed end on one side, as shown in FIG. 6. In this case, the second heat radiating member 150 is engaged with the light emitting module 100 through its open end such that the heat radiation plate 120 is closely surrounded by the second heat radiating member 150. Further, the second heat radiating member 150 has a slit or opening on its front wall. Therefore, the front portion of the casing 140 is exposed from the second heat radiating member 150, as shown in FIG. 6.

Also in this structure, advantageous effects similar to the above embodiment can be provided. In addition, heat radiation efficiency further improves. Furthermore, since the first and second extending portions 122A, 122B are provided symmetrically with respect to the optical axis LC, it is easy to fix the second heat radiating member 150 to the first heat radiating member 120.

Further, the shape of bend portions 131 of the terminal 130 is not limited to the Z letter shape shown in FIGS. 2 and 4. The bend portions may have another shape, such as crank or curve shape, as long as it can be flexible to follow the displacement of the light emitting module 100 with respect to the circuit board 200. Further, the bend portion 131 is not always necessary depending on a condition in use.

In the first embodiment, the first heat radiating member 120 is held such that the rear surface 121 is exposed from the casing 140. Instead, the first heat radiating member 120 can be constructed such that the middle portion 123 is embedded in the casing 140 and only the extending portions 122A, 122B are exposed from the casing 140.

In the first embodiment, the first heat radiating member 120 extends in the right and left direction on the rear side of the casing 140, i.e., in the direction perpendicular to the optical axis LC. Alternatively, the first heat radiating member 120 can be formed to extend in the front direction or in the rear direction from the side walls or the rear wall of the casing 140.

Further, it is not always necessarily that the first and second extending portions 122A, 122B are symmetric with respect to the optical axis LC. The first and second extending portions 122A, 122B can be asymmetrically formed. Furthermore, the second heat radiating member 150 may be eliminated.

Second Embodiment

A second embodiment of the present invention will be described with reference to FIGS. 7 to 9. Similar to the first embodiment, the lighting device is employed as the back light device of the vehicle instrument, but a mounting structure of the light emitting module 100 is different from that of the first embodiment. Hereafter, like components are denoted by like reference numerals, and a description thereof will not be repeated.

Figure 7:
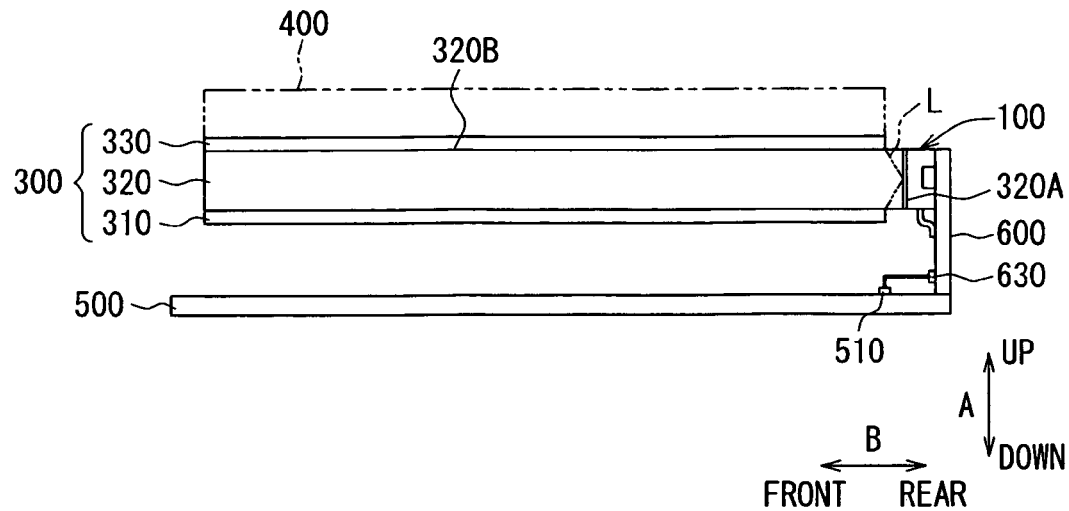
FIG. 7 is a side view of a back light device according to a second embodiment of the present invention.

As shown in FIG. 7, the back light device has the light emitting module 100, a first board (first circuit board) 500 for driving the light emitting module 100, a second board (second circuit board) 600 to which the light emitting module 100 is mounted, and the light diffusing member 300. The preceding components 100, 300, 500, 600 are arranged in respective positions in a case (not shown).

Similar to the first embodiment, the light emitting module 100 has the light emitting part for emitting light, the casing 140 housing the light emitting part, the heat radiating member (first heat radiating member) 120 for radiating heat generated from the light emitting part and the terminals 130. However, the structures of the heat radiating member 120 and the terminals 130 are different from those of the first embodiment. The light diffusing member 300 has a structure similar to the first embodiment.

The first board 500 and the light diffusing member 300 are arranged parallel to each other with a clearance. The second board 600 are disposed at ends of the first board 500 and the light diffusing member 300. The second board 600 is perpendicular to the first board 500 and the light diffusing member 300. Also, the second board 600 is arranged in a position where the light L from the light emitting module 100 can be incident on the light incident surface 320A.

Similar to the circuit board 200 of the first embodiment, the first board 500 is made of a resinous board such as a glass epoxy board. The first board 500 has an integrated circuit and circuit elements for driving respective components of the instrument. In the second embodiment, a connector 510 is mounted on a surface of the first board 500 for providing electrical connection with the second board 600.

The second board 600 is a metallic board (e.g., aluminum board). On the second board 600, an insulating layer 610 is entirely formed. A predetermined conductor pattern (not shown) is formed on the insulating layer 610. Further, conducting lands 620 onto which the terminals 130 are soldered are formed on the conductor pattern. The second board 600 is cut out into a rectangular shape such as by stamping after the conductor pattern is formed.

The second board 600 is formed with the connector 630 at its lower end that is adjacent to the first board 500. The connector 630 is for example connected to the connector 510 of the first board 500 through a harness. As such, the second board 600 is electrically connected to the first board 500. The terminals 130 of the light emitting diode 100 are soldered to the conducting lands 620, and the conductor pattern is electrically connected to the connector 630. Therefore, the light emitting module 100 is supplied with electric power from the first board 500.

Further, the second board 600 is formed with a heat radiating land 640 for radiating heat generated from the light emitting module 100. Similar to the conductor pattern, the heat radiating land 640 is formed on the insulating layer 610 with a predetermined shape. The heat radiating member 120 of the light emitting module 100 is joined to the heat radiating land 640 by soldering.

The conducting lands 620 and the heat radiating land 640 have the following positional relationship. As shown in FIGS. 8 and 9, the heat radiating land 640 is formed along an upper end 600A of the second board 600. The conducting land 620 is formed on a side opposite to the upper end 600A with respect to the heat radiating land 640.

For example, the heat radiating land 640 has a rectangular shape and its upper end is aligned with the upper end 600A of the second board 600. The conducting lands 620 are located below the heat radiating land 640. The conducting lands 620 are arranged next to each other in a direction parallel to the upper end 600A. Each of the conducting lands 620 have a rectangular shape, for example.

Also in this embodiment, the casing 140 is formed by molding. The casing 140 has a substantially box shape. The casing 140 has the light transmitting portion 141 on its front side 144, similar to the first embodiment. In the casing 140, the terminals 130 are connected to the electrodes of the dice of the light emitting part such as by wire bonding. Also, the dice is dielectrically in contact with the heat radiating member 120 inside of the casing 140 so as to facilitate transfer of heat generated from the light emitting element to the heat radiating member 120.

For example, the heat radiating member 120 has a rod shape having a rectangular-shaped cross-section. The heat radiating member 120 is made of metallic material having a relatively high coefficient of thermal conductivity. The heat radiating member 120 is arranged in a direction parallel to the upper end 600A of the second board 600. In other words, the heat radiating member 120 is disposed parallel to the longitudinal direction of the rectangular heat radiating land 640.

The heat radiating member 120 has an interior portion and exterior portions extending from ends of the interior portion. The casing 140 has a cavity on its rear side 146. The interior portion is received in the cavity of the casing 140 such that a rear surface of the interior portion is exposed from the casing 140. The exterior portions extend on the right and left sides of the casing 140.

Figure 9:
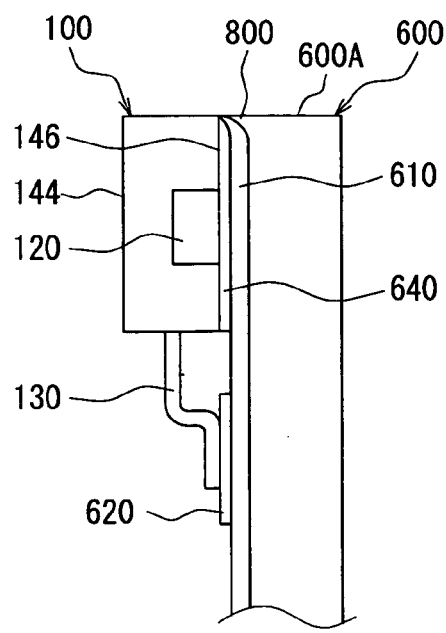
FIG. 9 is a schematic side view of the light emitting diode module mounted to the second board according to the second embodiment.

Further, a rear surface of the heat radiating member 120 and the rear surface (fixing surface) 146 of the casing 140 share a plane, as shown in FIG. 9. As such, in a condition that the casing 140 is mounted to the second board 600, the rear surface of the heat radiating member 120 entirely contacts the heat radiating land 640.

The terminals 130 are made of metallic pieces, which is bendable. Here, the terminal 130 project from the bottom wall of the casing 140 in a downward direction, i.e., in a direction separating from the upper end 600A. The lower ends of the terminals 130 are connected to the conducting lands 620 by soldering, respectively. Also, the terminals 130 are bent such that the lower ends thereof contact the conducting lands 620.

Further, the heat radiating member 120 is soldered to the heat radiating land 640 so that the upper surface of the casing 140 is aligned with the upper end 600A of the second circuit board 200 and the rear surface 146 is joined to the second board 600. Also, the terminals 130 are soldered to the corresponding conducting lands 620.

In the above back light device, when electric power is supplied to the light emitting module 100 from the first board 500, the light emitting module 100 emits the light L toward the light incident surface 320A of the light conducting plate 320. The light L is diffused in the light conducting plate 320 and is radiated from the light radiating surface 320B with uniformed brightness over the light radiating surface 320B toward the dial board 400. With this, the heat generated from the lighting element of the light emitting module 100 is transferred to the heat radiating member 120. The heat is further transferred to the second board 600 through the heat radiating land 640 and is released from the second board 600.

Incidentally, when the second board 600 is formed by stamping, the end of the second board 600 will have burrs 800, as shown in FIG. 9. In a case that the burrs 800 project on the surface on which the heat radiating land 640 is formed, the burrs 800 will contact the heat radiating land 640. In a general circuit board, a land is formed at a position separate from the end of the circuit board with a margin (e.g., 1 to 2 mm) to prevent a short circuit between the land and the circuit board due to such burrs.

In the second embodiment, the heat radiating land 640 and the conducting lands 620 are separately formed. Therefore, it is less likely that a short circuit will occur even if the heat radiating land 640 contacts the second board 600.

Further, since the conducting lands 620 are formed below the heat radiating land 640, i.e., on a side opposite to the upper end 600A of the second board 600 with respect to the heat radiating land 640, it is less likely that the conducting lands 620 will short-circuit with the second board 600 due to burrs 800.

Accordingly, the heat radiating land 640 is arranged along the upper end 600A of the second board 600. Thus, the dimension of the second board 600 in the direction perpendicular to the first board 500 reduces. Also, the light emitting module 100 can be arranged such that its upper wall is aligned with to the upper end 600A of the second board 600. Therefore, the size of the back light device in the direction perpendicular to the first board 500 reduces.

In addition, since the heat radiating member 120 has the exterior portions extending on the opposite sides of the casing 140, it is easy to check whether the heat radiating member 120 is properly soldered with the heat radiating land 640. Accordingly, cold joint of soldering reduces.

Third Embodiment

A third embodiment will be described with reference to FIG. 10. In the third embodiment, the back light device has a structure same as that of the second embodiment, except for the structure of the heat radiating member 120.

Figure 10:
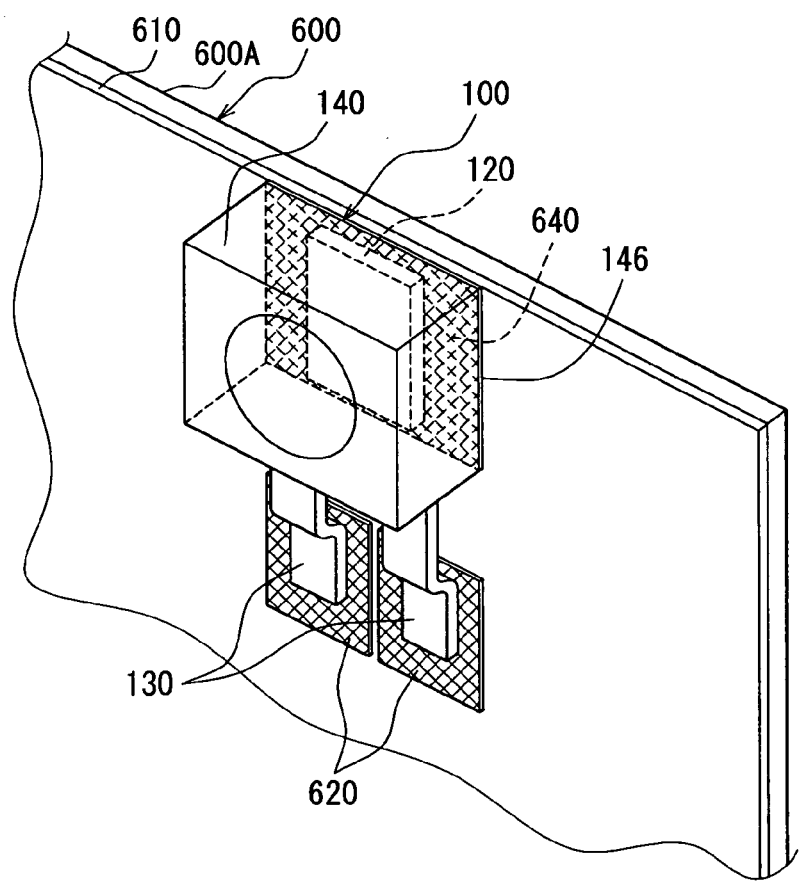
FIG. 10 is an enlarged partial perspective view of a light emitting diode module mounted to a second board according to a third embodiment of the present invention.

As shown in FIG. 10, the heat radiating member 120 has a plate shape. The casing 140 has a cavity or opening on its rear side 146. The heat radiating member 120 is housed in the cavity such that its rear surface is exposed from the rear side 146 of the casing 140.

Figure 8:
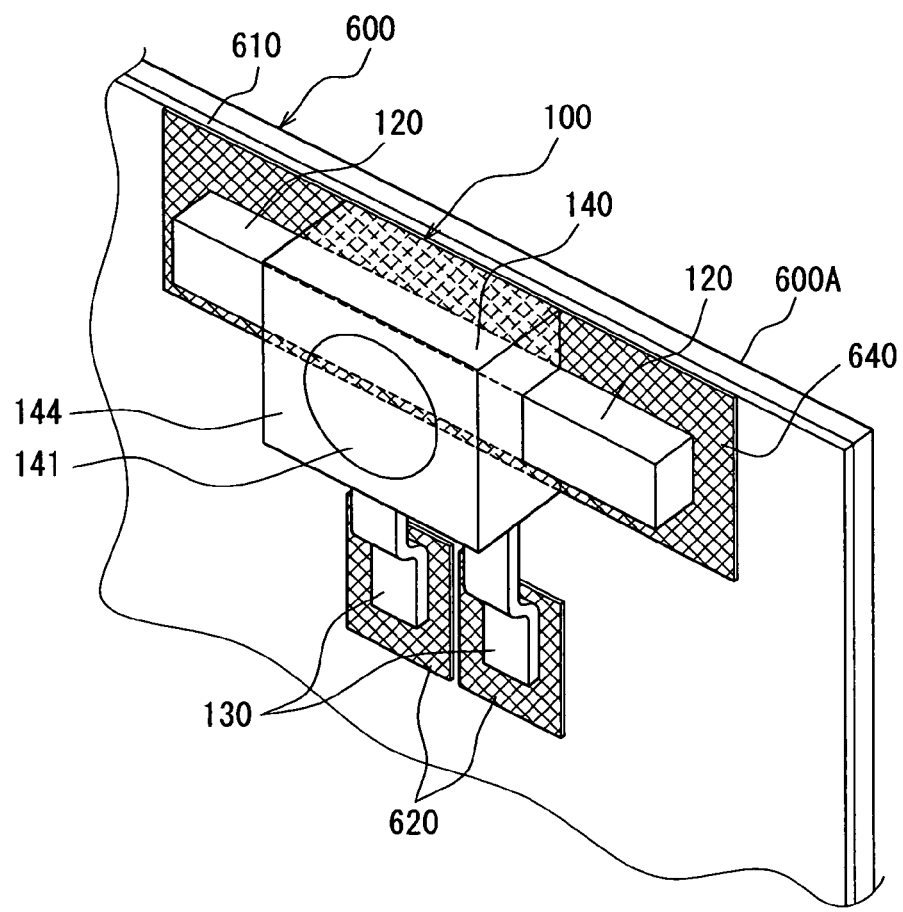
FIG. 8 is a perspective view of a light emitting diode module of the back light device mounted to a second board according to the second embodiment.

Further, the rear surface of the heat radiating member 120 has an area that is substantially the same as the rear surface of the heat radiating member 120 shown in FIG. 8. Namely, the second heat radiating member 120 has the same contact area, which makes contact with the heat radiating land 640, as that of the heat radiating member 120 of the second embodiment. For example, the heat radiating member 120 is connected to the heat radiating land 640 by reflow soldering.

Since the heat radiating member 120 is housed in the rear portion 146 of the casing 140, a space for mounting the heat radiating member 120 reduces. Thus, plural light emitting modules 100 can be mounted to the second board 600 close to each other. This will be effective to increase brightness of the light radiated toward the dial board 400.

Fourth Embodiment

A fourth embodiment will be described with reference to FIG. 11. In the fourth embodiment, the structure of the heat radiating member 120 is different from that of the second embodiment. Structures other than the heat radiating member 120 are similar to those of the second embodiment.

Figure 11:
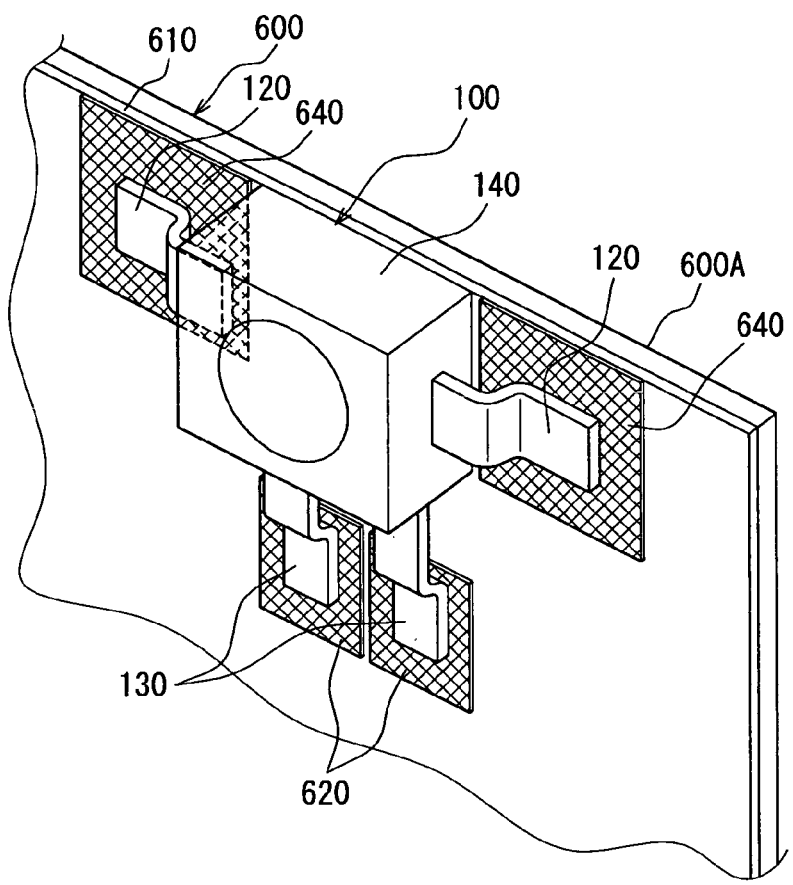
FIG. 11 is an enlarged partial perspective view of a light emitting diode module mounted to a second board according to a fourth embodiment of the present invention.

As shown in FIG. 11, the heat radiating member 120 is a metallic piece or plate that is bendable. The heat radiating member 120 extends from both right and left sides of the casing 140 in the right and left direction. The exterior portions of the heat radiating member 120 are bent such that the respective ends thereof are in contact with the heat radiating land 640. The ends of the heat radiating member 120 are soldered to the corresponding heat radiating lands 640.

Fifth Embodiment

A fifth embodiment of the present invention will be described with reference to FIG. 12. In the fifth embodiment, structures of the terminals 130, which extend from the casing 140, are different from those of the second embodiment. Structures other than the terminals 130 are similar to hose of the second embodiment.

Figure 12:
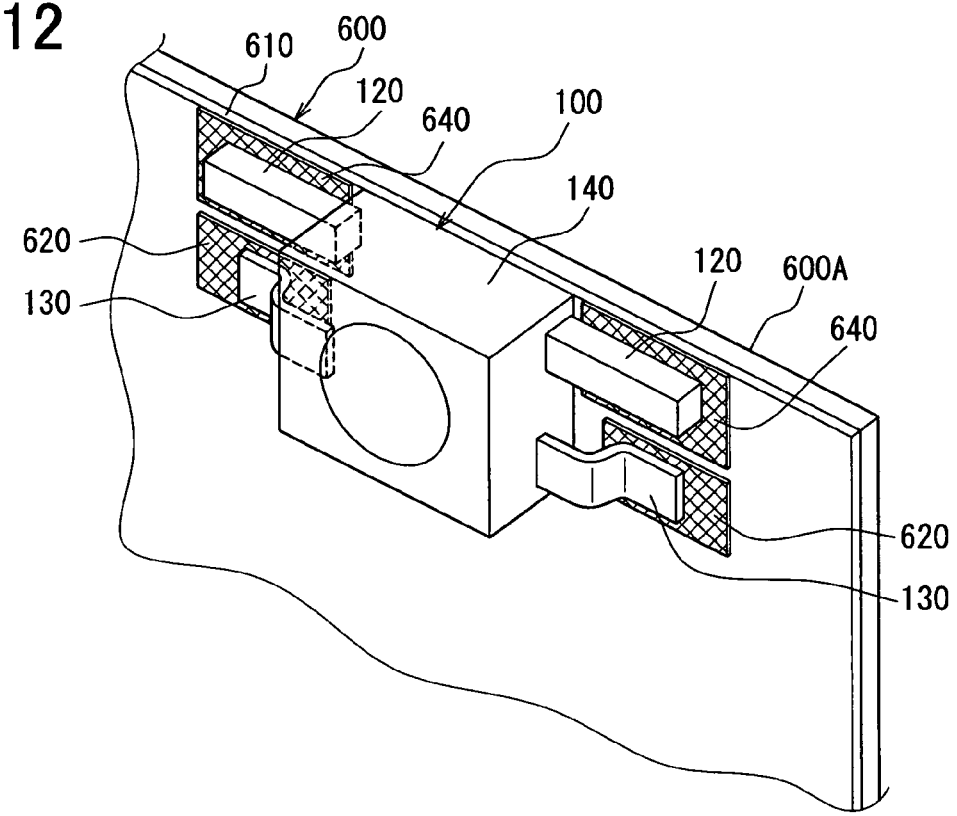
FIG. 12 is an enlarged partial perspective view of a light emitting diode module mounted to a second board according to a fifth embodiment of the present invention.

As shown in FIG. 12, the heat radiating member 120 have the exterior portions extending from upper portions of the right and left sides of the casing 140 in the right and left direction. Further, the terminals 130 extend from lower portions of the right and left sides of the casing 140 in the right and left direction.

Here, the heat radiating member 120 can have the structure of the third embodiment shown in FIG. 10 or the structure of the fourth embodiment shown in FIG. 11. Further, the heat radiating member 120 can have other structures.

In the fifth embodiment, each of the conducting lands 620 is formed at a position lower than the heat radiating land 640. However, the positions of the conducting lands 620 are higher than those of the second embodiment shown in FIG. 8. Namely, the conducting lands 620 are formed next to the right and left sides of the casing 140. Therefore, the conducting lands 640 are more spaced from each other than that of the second embodiment shown in FIG. 8. As such, a mounting space of the light emitting module 100 is reduced in the up and down direction of the second board 600.

Sixth Embodiment

Figure 13:
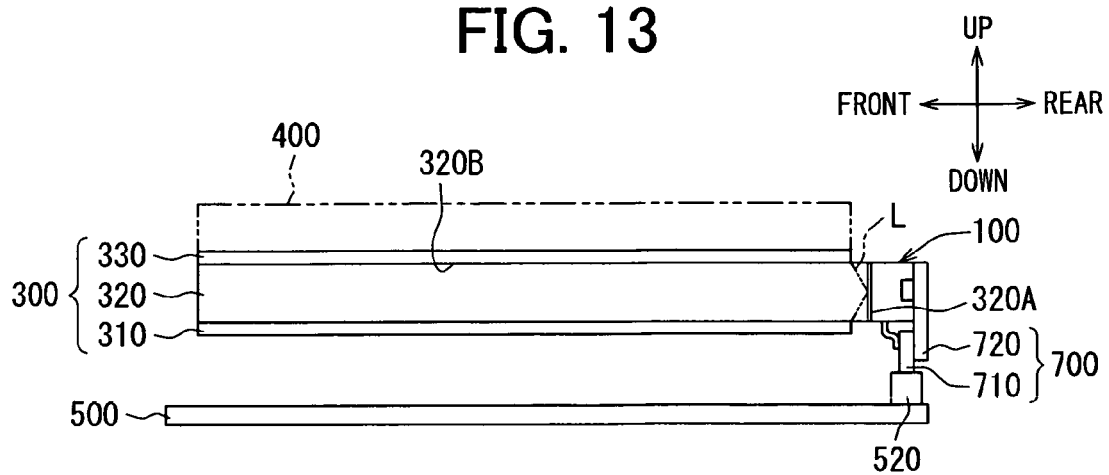
FIG. 13 is a side view of a back light device according to a sixth embodiment of the present invention.

A sixth embodiment of the present invention will be described with reference to FIGS. 13 to 15. As shown in FIG. 13, a lighting device is employed as a back light device of an instrument of a vehicle, similar to the first to fifth embodiments. Here, like components are denoted by like reference characters and a description thereof is not repeated.

As shown in FIG. 13, the back light device has a second board 700 on which light emitting modules 100 are mounted, instead of the second board 600 of the second to fifth embodiments. The first board 500 is disposed parallel to the light diffusing member 400 with a clearance between them. The second board 700 is disposed perpendicular to the first board 500 and the light diffusing member 400 at the ends of the first board 500 and the light diffusing member 400. The second board 700 is disposed at a position where the light L emitted from the light emitting module 100 can be incident on the light incident surface 320A of the light diffusing member 300.

Each of the light emitting module 100 has the casing 140, the heat radiating member 120 and the terminals 130. The light emitting module 100 has a structure similar to that of the second embodiment shown in FIG. 8. Alternatively, the light emitting module 100 can have the similar structure of any one of the third to fifth embodiments.

Figure 14:
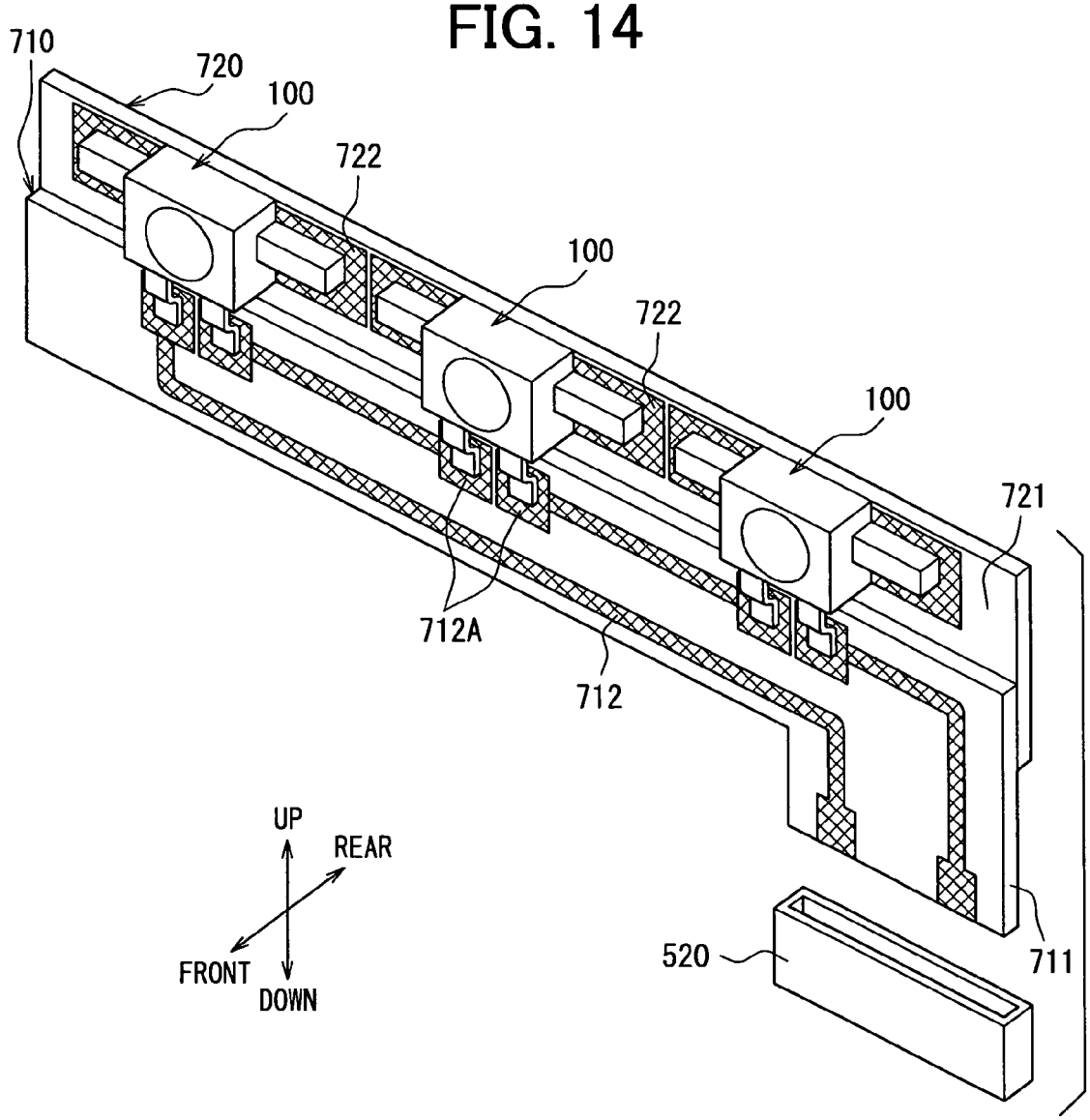
FIG. 14 is a perspective view of light emitting diode modules and a second board of the back light device according to the sixth embodiment.
Figure 15:
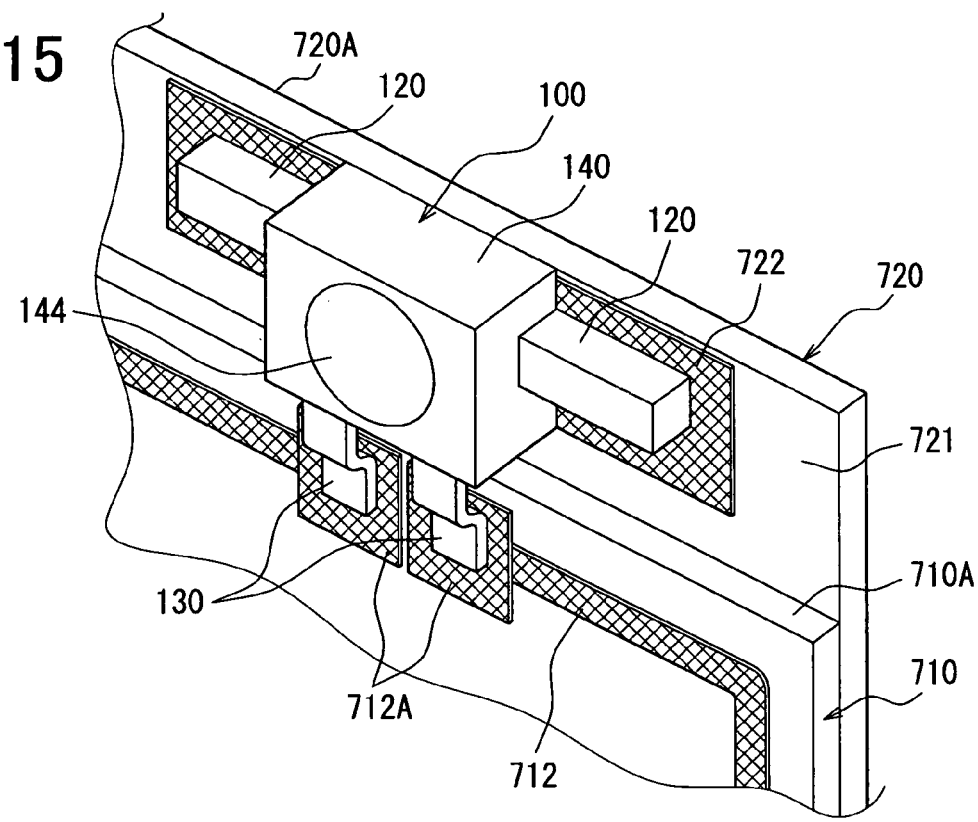
FIG. 15 is an enlarged partial perspective view of the light emitting diode module and the second board according to the sixth embodiment.

The first board 500 has a connector 520 for receiving a connecting portion 711 of the second board 700 shown in FIG. 14. When the connecting portion 711 is inserted in the connector 520, the first board 500 is electrically connected to the second board 700 so that electric power is supplied to the light emitting modules 100.

The second board 700 is constructed of a power supplying board (circuit board) 710 for supplying the electric power to the light emitting module 100 and a heat radiating plate 720 for radiating heat generated from the light emitting module 100.

The power supplying board 710 is made of a resinous board such as a glass epoxy board or a flexible board made of polyimide. The power supplying board 710 has a substantially rectangular shape. The power supplying board 710 includes the connecting portion 711, which has a rectangular shape and extends from a lower end of the power supplying board 710. Further, the connecting portion 711 is received in the connector 510 in a closely engaging manner.

Further, the power supplying board 710 is formed with a conductor pattern 712 on its surface. The conductor pattern 712 includes conducting lands 712A at positions corresponding to the terminals 130 of the light emitting module 100. The terminals 130 of the light emitting module 100 are soldered to the lands 712A. The conductor pattern 712 extends to the connecting portion 711. As such, when the connecting portion 711 is received in the connector 520, the conductor pattern 712 is electrically connected to the first board 500.

The lands 712A are arranged in pairs. The pairs of lands 712A are arranged in a longitudinal direction of the power supplying board 710. The terminals 130 of each light emitting module are connected to the pair of lands 712A. Also, the conductor pattern 712 is constructed such that the light emitting modules 100 are connected in series.

The heat radiating plate 720 is disposed on the rear surface of the power supplying board 710. The heat radiating plate 720 is offset from the power supplying board 710 with a predetermined amount in the upward direction. The heat radiating plate 720 and the power supplying board 710 are integrated through a bonding layer, for example.

The heat radiating plate 720 is for example made of an aluminum plate by stamping. The heat radiating plate 720 has a rectangular shape. Since the heat radiating plate 720 is offset from the power supplying board 710 in the upward direction, an upper portion of the front surface of the second board 700 is exposed. Hereafter, the exposed upper portion is referred to as an exposed section 721.

On the exposed section 721, nickel coatings 722 are formed along the upper end 720A of the heat radiating plate 720. The heat radiating members 120 of the light emitting modules 100 are soldered to the nickel coatings 722.

Similar to the second embodiment, the heat radiating member 120, which has a rod shape with a rectangular cross-section, includes the interior portion and the exterior portions. The interior portion is disposed in the cavity formed on the rear side of the casing 140 such that its rear surface is exposed from the cavity. The exterior portions extend from the right and left sides of the casing 140 in the right and left direction. Further, the rear surface of the heat radiating member 120 and the rear surface of the casing 140 share a plane. As such, in a condition that the casing 140 is mounted to the second board 700, the rear surface of the heat radiating member 120 entirely contact the nickel coating 722.

Further, the terminals 130 are made of metallic pieces that are bendable. The terminals 130 project from the lower wall of the casing 140 in the downward direction. The terminals 130 are bent such that ends thereof contact and are soldered to the lands 712A.

The heat radiating member 120 of each light emitting module 100 is soldered to the nickel coating 722 in a condition that the upper wall of the casing 110 is aligned with the upper end 700A of the heat radiating plate 720. Further, the terminals 130 are soldered to the lands 712A of the power supplying board 710.

In this construction, the light emitting modules 100 receives electric power through the power supplying board 710 and radiates heat through the heat radiating plate 720. That is, because the conductor pattern 712 is not formed on the heat radiating plate 720, the heat radiating plate 720 does not need to have an insulating layer.

As such, because the heat generated from the light emitting module 100 is transferred directly to the heat radiating plate 720 from the heat radiating member 120, heat radiation is facilitated. Accordingly, a heat radiating performance further improves.

Here, since the heat radiating plate 720 is disposed on the rear surface of the power supplying board 710, the rear surface of the heat radiating plate 720 is entirely exposed. As such, the heat radiating performance further improves. Further, since the heat radiating plate 720 is offset from the power supplying plate 710, the exposed section 721 for mounting the light emitting modules 100 is formed by a simple structure.

Also, the second board 700 is electrically connected to the first boar 500 by inserting the connecting portion 711 to the connector 520 of the first board 500. Therefore, it is easy to connect the first board 500 and the second board 700.

Moreover, the bodies 140 of the light emitting modules 100 are arranged such that the upper walls thereof are aligned with the upper end 720A of the heat radiating plate 720. Because the area adjacent to the upper end 720A of the heat radiating plate 720 is effectively used, the height of the back light device reduces.

Figure 16:
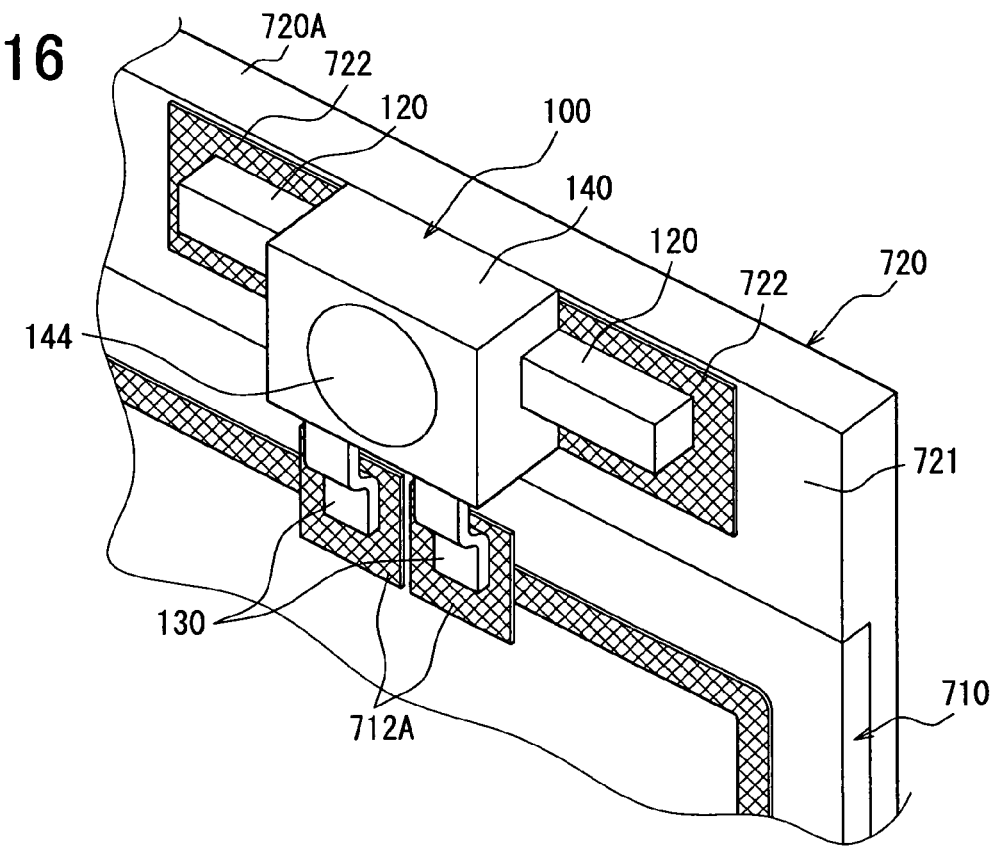
FIG. 16 is an enlarged partial perspective view of the light emitting diode module and another example of the second board according to the sixth embodiment.

FIG. 16 shows another example of the heat radiating plate 720. In the heat radiating plate 720 shown in FIG. 16, the thickness of the exposed section 721 is increased such that the front surface of the exposed section 721 and the front surface of the power supplying board 710 share a plane. In this case, it is easy to connect the heat radiating member 120 and the terminals 130 to the power supplying board 710 and the heat radiating plate 720, respectively.

Seventh Embodiment

Figure 17:
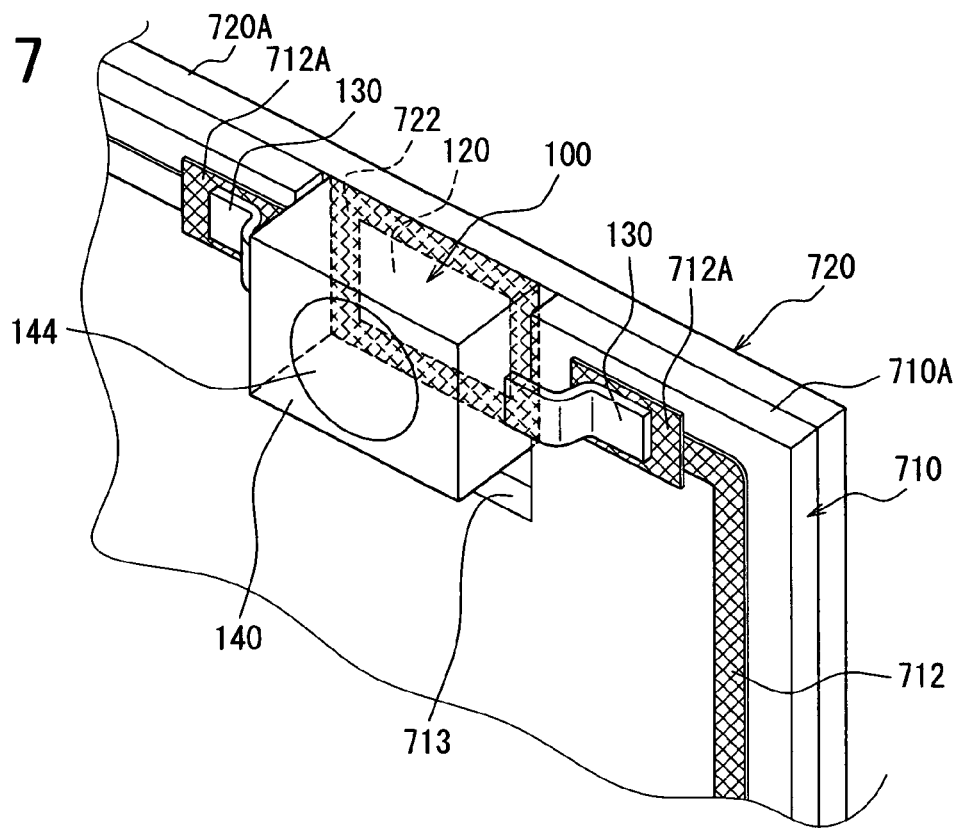
FIG. 17 is an enlarged partial perspective view of a light emitting diode module and a second board according to a seventh embodiment of the present invention.

A seventh embodiment of the present invention will be described with reference to FIG. 17. As shown in FIG. 17, the power supplying board 710 and the heat radiating plate 720 are disposed such that the upper ends 710A, 720A thereof are aligned. Further, the power supplying board 710 is formed with a notch 713 adjacent to its upper end 710A. The notch 713 has a shape substantially corresponding to an outline of the casing 140 so that the casing 140 is received. Also, the conducting lands 712A are formed on opposite sides of the notch 713. The nickel coating 722 is formed on a portion of the heat radiating plate 720 corresponding to the notch 713.

The terminals 130 project from the right and left sides of the casing 140 in the right and left direction. Also, the heat radiating member 120 is disposed on the rear side of the casing 140 such that the rear surface of the heat radiating member 120 is exposed from the casing 140, similar to the third embodiment shown in FIG. 10.

The casing 140 is disposed in the notch 713 such that its upper end is aligned with the upper end 720A of the heat radiating plate 720. The heat radiating member 120 is soldered to the nickel coating 722. The terminals 130 are soldered to the lands 712A.

Eighth Embodiment

Figure 18:
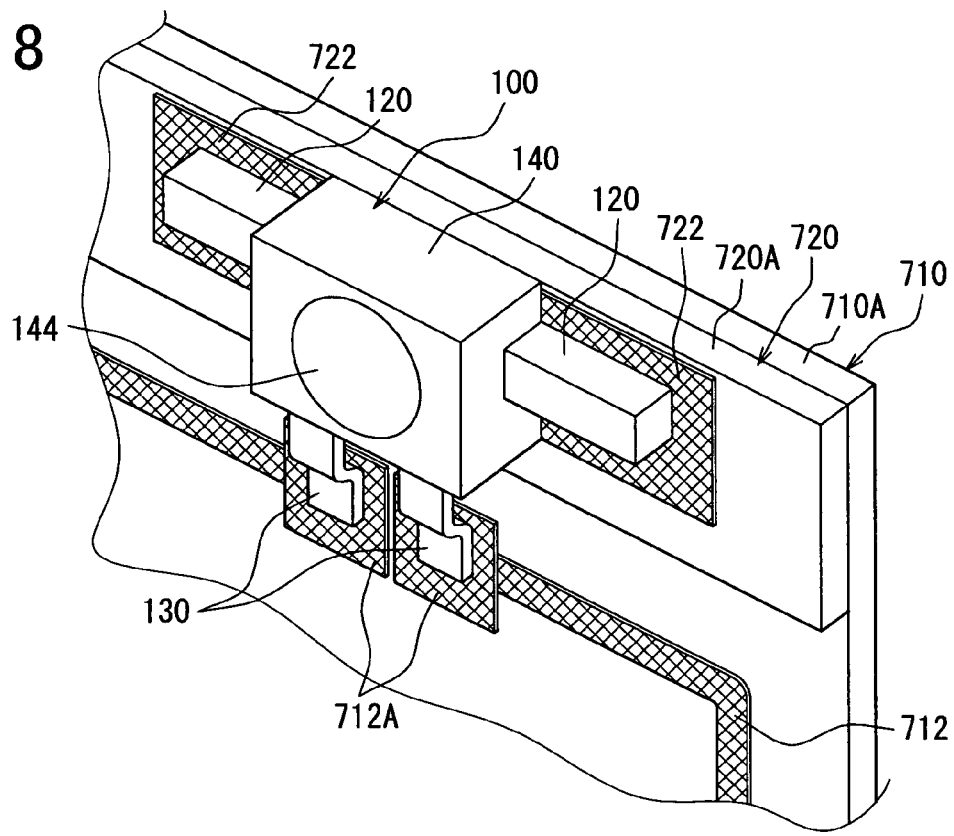
FIG. 18 is an enlarged partial perspective view of a light emitting diode module and a second board according to an eighth embodiment of the present invention.

Next, an eighth embodiment of the present invention will be described with reference to FIG. 18. As shown in FIG. 18, the power supplying board 710 and the heat radiating plate 720 are disposed such that the upper ends 710A, 720A thereof are aligned. Here, the heat radiating plate 720 is arranged on the front surface of the power supplying board 710. The heat radiating plate 720 is smaller than the power supplying board 710. Therefore, a lower portion of the power supplying board 720 is exposed. The conductor pattern 712 is formed on the exposed portion of the power supplying board 720.

Ninth Embodiment

Figure 19:
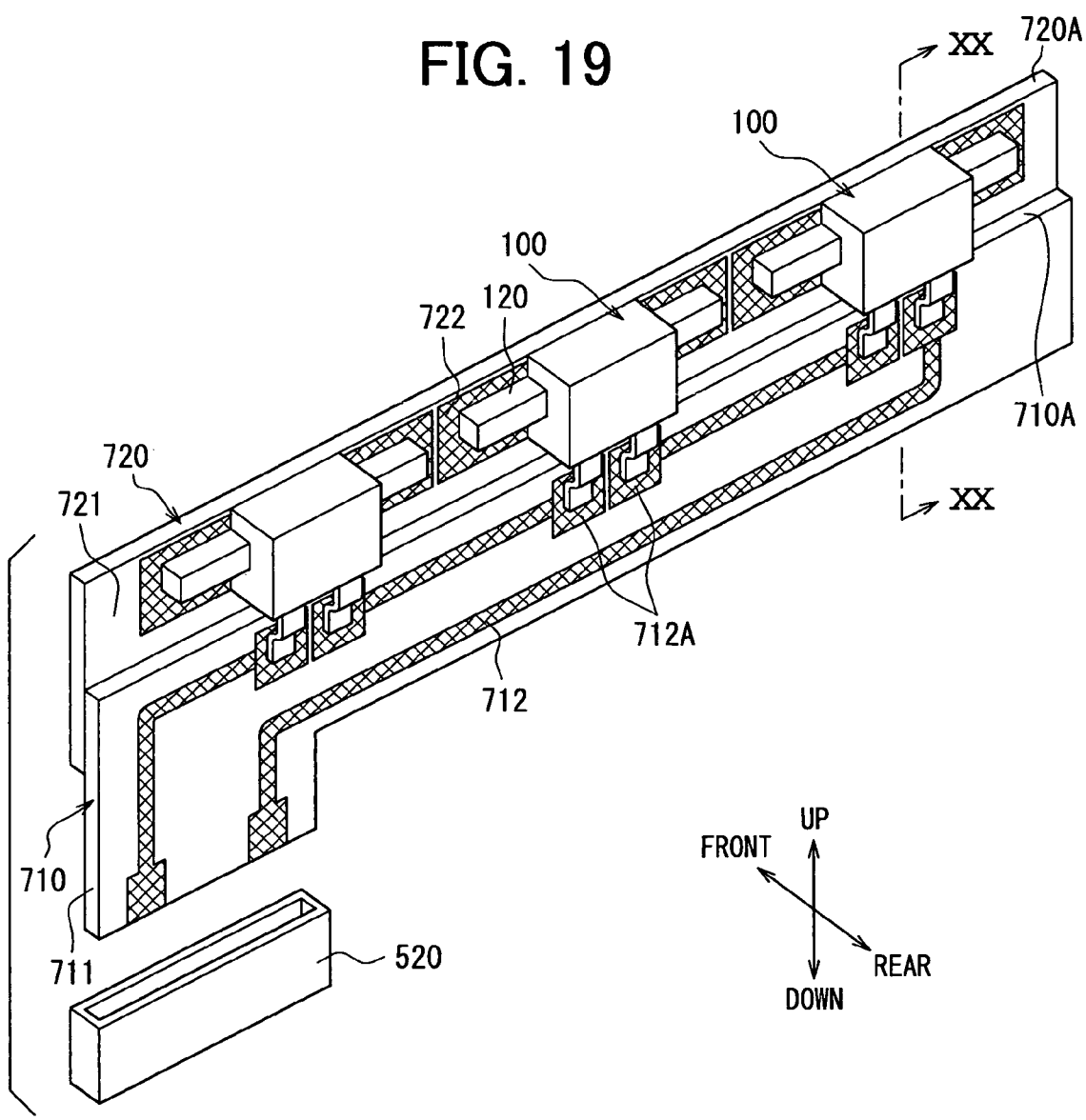
FIG. 19 is a perspective view of light emitting diode modules and a second board of a back light device according to a ninth embodiment of the present invention.
Figure 20:
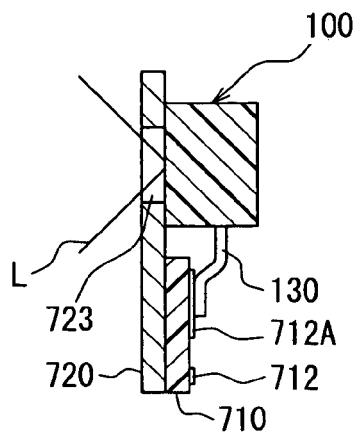
FIG. 20 is a schematic cross-sectional view of the light emitting diode module and the second board taken along a line XX-XX in FIG. 19.

A ninth embodiment will be described with reference to FIGS. 19 and 20. As shown in FIGS. 19 and 20, the heat radiating plate 720 is arranged along the front surface of the power supplying board 710. The heat radiating plate 720 and the power supplying board 710 are offset in the up and down direction such that the upper end 720A of the heat radiating plate 720 is higher than the upper end 710A of the power supplying board 710. Thus, the rear surface of the heat radiating plate 720 is partly exposed from the power supplying board 710.

The exposed portion of the heat radiating plate 720, which is located higher than the power supplying board 710, is formed with openings 723. The nickel coatings 722 are formed on opposite sides of each opening 723. Further, the conductor pattern 712 is formed on the rear surface of the power supplying board 710.

Each light emitting module 100 is arranged such that such that the light L can pass through the opening 723. The heat radiating member 120 of each light emitting module 100 is soldered to the nickel coatings 722. Further, the terminals 130 are soldered to the conducting lands 712A of the power supplying board 710.

The present invention should not be limited to the embodiments discussed above and shown in the figures, but may be implemented in various ways without departing from the spirit of the invention. The present invention may be implemented with any combinations of the above embodiments. Further, the above embodiments may be modified as follows.

In the above second to fifth embodiment, the second board 600 is made of aluminum. However, the second board 600 can be made of other metallic material such as copper. Also, the heat radiating land 640 is formed such that its upper end is aligned with the upper end 600A of the second board 600.

However, the heat radiating land 640 can be formed such that its end is aligned with any end of the second board 600, such as a left end, a right end or a lower end.

In the sixth to ninth embodiments, the light emitting modules 100 are mounted such that its upper walls are aligned with the upper end 720A of the heat radiating plate 720. However, the light emitting modules 100 can be arranged such that its upper walls are lower than the upper end 720A of the heat radiating plate 720.

In the sixth to ninth embodiments, the connecting portion 211 is formed in the power supplying board 710. However, the power supplying board 710 and the first circuit board 300 can be electrically connected through a harness, in a manner similar to the second embodiment shown in FIG. 7.

In the sixth, eighth, and ninth embodiment, the heat radiating member 120 projects from the right and left sides of the casing 140 in the right and left direction. Alternatively, the heat radiating member 120 can project from the rear surface of the casing 140.

In the sixth to ninth embodiments, the heat radiating plate 720 is made of aluminum board. However, the heat radiating plate 720 can be made of another metallic material. For example, the heat radiating plate 720 can be made of copper. In this case, it is not necessary to form the nickel coatings 722 for soldering the heat radiating member 120.

In the above embodiments, the heat radiating member 120 is fixed by soldering. However, the heat radiating member 120 can be fixed by other means such as screwing, welding, or bonding with a silver paste.

What is claimed is:

1. A lighting device comprising:
    a circuit board having a metal base, a heat radiating land and a conducting land, the heat radiating land disposed such that its end is aligned with and coincident with an end of the metal base, and the conducting land disposed on an opposite side of the heat radiating land with respect to the end of the metal base;
    a light emitting module for emitting light, the light emitting module has a casing, a heat radiating member, and a terminal, wherein
    the casing has a first surface through which the light is emitted and a second surface opposite to the first surface and joined to the circuit board,
    the heat radiating member is disposed to the casing such that at least a part of the heat radiating member is exposed from the casing and connected to the heat radiating land, and
    the terminal extends from the casing and connects to the conducting land.

2. The lighting device according to claim 1, wherein the terminal extends from the casing in a direction opposite to the end of the metal base.

3. The lighting device according to claim 1, wherein the terminal extend from the casing in a direction parallel to the end of the metal base.

4. The lighting device according to claim 1, wherein the casing defines an opening on the second surface, and the heat radiating member is received in the opening.

5. The lighting device according to claim 1, wherein
    the casing defines an opening on the second surface,
    the heat radiating member has an interior portion disposed in the opening of the casing such that a surface of the interior portion is exposed from the casing, and
    the casing is mounted to the circuit board such that the opening is covered by the heat radiating land and the surface of the interior portion contacts the heat radiating land.

6. The lighting device according to claim 1, wherein
    the heat radiating member has an interior portion disposed in the casing and an exterior portion extending from the interior portion and located outside of the casing, and
    the exterior portion extends in a direction parallel to the end of the metal base.

7. The lighting device according to claim 6, wherein the exterior portion is in contact with the heat radiating land.

8. The lighting device according to claim 1, further comprising:
    a light diffusing member for diffusing light therein, wherein the light diffusing member has a light incident surface for allowing light to enter therein and a light radiating surface perpendicular to the light incident surface for radiating the light diffused therein toward a radiation area, wherein
    the circuit board is disposed parallel to the light incident surface.

9. The lighting device according to claim 1, wherein the heat radiating member extends beyond an outer periphery of the casing.

\* \* \* \* \*